(12) United States Patent
Jeong et al.

(10) Patent No.: US 9,570,042 B2
(45) Date of Patent: Feb. 14, 2017

(54) FLEXIBLE DISPLAY DEVICE AND METHOD OF CONTROLLING THE SAME

(71) Applicant: Samsung Display Co., Ltd., Yongin, Gyeonggi-Do (KR)

(72) Inventors: Chul-Woo Jeong, Yongin (KR); Soon-Ryong Park, Yongin (KR); Woo-Suk Jung, Yongin (KR); Jung-Ho So, Yongin (KR); Tae-Eun Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 179 days.

(21) Appl. No.: 14/027,171

(22) Filed: Sep. 14, 2013

(65) Prior Publication Data

US 2014/0306985 A1    Oct. 16, 2014

(30) Foreign Application Priority Data

Apr. 16, 2013    (KR) .......................... 10-2013-0041831

(51) Int. Cl.
G09G 5/06        (2006.01)
G06F 1/16        (2006.01)
G09G 3/32        (2016.01)

(52) U.S. Cl.
CPC ............... *G09G 5/06* (2013.01); *G06F 1/1652* (2013.01); *G09G 3/3233* (2013.01);
(Continued)

(58) Field of Classification Search
CPC .............. G09G 5/06; G09G 2300/0819; G09G 2300/0842; G09G 2300/0861; G09G 2310/0262; G09G 2320/0233; G09G 2320/0242; G09G 2380/02; G09G 3/3233; G06F 1/1652; H01L 2251/5338
See application file for complete search history.

(56) References Cited

U.S. PATENT DOCUMENTS 5,768,812 A *   6/1998  Cross .............................. 40/120
7,443,468 B2 * 10/2008  Okita et al. ................... 349/107
(Continued)

FOREIGN PATENT DOCUMENTS

CN      101425264 B    5/2009
EP      2315186        4/2011
(Continued)

OTHER PUBLICATIONS

Extended European Search Report issued on Jul. 10, 2014 by EPO in connection with European Patent Application No. 13188558.4 which also claims Korean Patent Application No. 10-2013-0041831 as its priority document.

(Continued)

*Primary Examiner* — Afroza Chowdhury
(74) *Attorney, Agent, or Firm* — Robert E. Bushnell, Esq.

(57) ABSTRACT

Provided are a flexible display device and a method of controlling the same. The flexible display device includes: a display unit including a first display area and a second display area bendable with respect to the first display area; and a control unit correcting at least one of a brightness and color coordinate of an image to be displayed in at least one of the first display area and the second display area according to a degree of bending between the first display area and the second display area.

16 Claims, 8 Drawing Sheets

(52) U.S. Cl.
CPC .............. *G09G 2300/0819* (2013.01); *G09G 2300/0842* (2013.01); *G09G 2300/0861* (2013.01); *G09G 2310/0262* (2013.01); *G09G 2320/0233* (2013.01); *G09G 2320/0242* (2013.01); *G09G 2380/02* (2013.01); *H01L 2251/5338* (2013.01)

(56) References Cited

U.S. PATENT DOCUMENTS

| | | | |
|---|---|---|---|
| 2006/0109391 A1* | 5/2006 | Huitema et al. ............... 349/19 | |
| 2007/0024604 A1* | 2/2007 | Jang ......................... G09G 3/20 | |
| | | | 345/204 |
| 2007/0052699 A1 | 3/2007 | Karman et al. | |
| 2008/0018630 A1* | 1/2008 | Fujino ................. G09G 3/3648 | |
| | | | 345/205 |
| 2009/0140972 A1 | 6/2009 | Park et al. | |
| 2010/0056223 A1* | 3/2010 | Choi et al. .................... 455/566 | |
| 2010/0117975 A1* | 5/2010 | Cho ................ 345/173 | |
| 2010/0187979 A1 | 7/2010 | Shim et al. | |
| 2011/0122559 A1 | 5/2011 | Lee et al. | |
| 2011/0221937 A1* | 9/2011 | Park ...................... H04N 9/045 | |
| | | | 348/242 |
| 2012/0014054 A1 | 1/2012 | Ashcraft et al. | |
| 2013/0010405 A1 | 1/2013 | Rothkopf et al. | |
| 2013/0155052 A1* | 6/2013 | Ko ..................... H04N 13/0022 | |
| | | | 345/419 |
| 2013/0215041 A1* | 8/2013 | Kim et al. .................... 345/173 | |
| 2014/0118319 A1* | 5/2014 | Jeon .............................. 345/207 | |

FOREIGN PATENT DOCUMENTS

| | | |
|---|---|---|
| JP | 2006243360 A | 9/2006 |
| JP | 2009-147753 A | 7/2009 |
| KR | 10-2009-0020790 A | 2/2009 |
| KR | 10-2009-0058316 A | 6/2009 |

OTHER PUBLICATIONS

European Search Report issued by European Patent Office on Dec. 7, 2015 in connection with European Patent Application No. 13188558.4, which also claims Korean Patent Application Serial No. 10-2013-0041831 as its priority document.

Summons to oral proceedings issued by EPO on May 4, 2016 in corresponding European Patent Application No. 13188558.4, which also claims Korean Patent Application No. 10-2013-0041831 as its priority application.

* cited by examiner

FLEXIBLE DISPLAY DEVICE AND METHOD OF CONTROLLING THE SAME

CLAIM OF PRIORITY

This application claims the benefit of Korean Patent Application No. 10-2013-0041831, filed on Apr. 16, 2013, in the Korean Intellectual Property Office, the disclosure of which is incorporated herein in its entirety by reference.

BACKGROUND OF THE INVENTION

Field of the Invention

The present invention relates to a flexible display device and a method of controlling the same, and more particularly, to a flexible display device improving an image quality when a display unit bends and a method of controlling the same.

Description of the Related Art

In general, flat display devices are classified into light emitting type display devices and light receiving type display devices. The light emitting type display devices include an organic light emitting display (OLED) device, a plasma display panel (PDP), a flat cathode ray tube (FCRT), a vacuum fluorescent display (VFD) panel and a light emitting diode (LED) panel, and the light receiving type display devices include a liquid crystal display (LCD) panel.

Among them, the OLED has a wide viewing angle, excellent contrast, and fast response speed. Accordingly, since the OLED is applied to the displays of mobile devices such as a digital camera, a video camera, a portable information terminal, a smart phone, an ultra slim notebook computer, and a tablet personal computer or electrical/electronic products such as an ultra thin television, it receives great attentions.

Flexible display devices having portability and capable of being applied to various forms of devices are recently researched and developed as next generation display devices. Among them, an OLED technology based flexible display device is regarded as the most promising display device.

SUMMARY OF THE INVENTION

The present invention provides a flexible display device that improves a non-uniform image quality when a display unit bends and a method of controlling the same.

According to an aspect of the present invention, there is provided a flexible display device including: a display unit including a first display area and a second display area bendable with respect to the first display area; and a control unit correcting at least one of a brightness and color coordinate of an image to be displayed in at least one of the first display area and the second display area according to a degree of bending between the first display area and the second display area.

The flexible display device may further include a sensing unit measuring the degree of bending between the first display area and the second display area.

The second display area may be bendable in a front or rear direction of the display unit, with respect to the first display area.

The second display area may include a bending area bendable and a flat area having a flat form. The bending area may connect the flat area to the first display area.

A degree of correction of a sub-pixel of the second display area may be larger as a pixel is farther away from the first display area.

The control unit may correct an image to be displayed in the second display area to reduce a brightness of the image to be displayed in the second display area when the second display area bends toward a front direction of the display unit.

The control unit may correct an image to be displayed in the second display area to reduce a blue color of the image to be displayed in the second display area when the second display area bends toward a front direction of the display unit.

The control unit may correct an image to be displayed in the second display area to increase a brightness of the image to be displayed in the second display area when the second display area bends toward a rear direction of the display unit.

The control unit may correct an image to be displayed in the second display area to reduce a red color of the image to be displayed in the second display area when the second display area bends toward a rear direction of the display unit.

The flexible display device may further include a lookup table including correction values predetermined according to the degree of bending between the first display area and the second display area, wherein the control unit may receive a correction value corresponding to the degree of bending between the first display area and the second display area from a correction unit by using the lookup table and corrects an image to be displayed on the display unit.

The flexible display device may further include a slap unit attached to one side of the display unit to be bent together with the display unit. A portion of the slap unit corresponding to an interface between the first display area and the second display area may be bent while the second display area is bent with respect to the first display area.

The slap unit may include a form variable unit including a bent unit that maintains a bending form even when the display unit is not bent. The bent unit may be disposed at the interface between the first display area and the second display area.

According to another aspect of the present invention, there is provided a method of controlling a flexible display device including a first display area and a second display area bendable with respect to the first display area, the method including: measuring a degree of bending between the first display area and the second display area; correcting at least one of a brightness and color coordinate of an image to be displayed in at least one of the first display area and the second display area according to the degree of bending to produce a corrected image; and displaying the corrected image.

The second display area may be bendable in a front or rear direction of the display unit, with respect to the first display area.

The second display area may include a bending area bendable and a flat area having a flat form. The bending area may connect the flat area to the first display area.

A degree of correction of a pixel in the second display area may be larger as the pixel is farther away from the first display area.

The correcting the at least one of the brightness and the color coordinate may include correcting an image to be displayed in the second display area to reduce the brightness of the image to be displayed in the second display area when the second display area bends toward a front direction of the display unit.

The correcting the at least one of the brightness and the color coordinate may include correcting an image to be displayed in the second display area to reduce a blue color of the image to be displayed in the second display area when the second display area bends toward a front direction of the display unit.

The correcting the at least one of the brightness and the color coordinate may include correcting an image to be displayed in the second display area to increase the brightness of the image to be displayed in the second display area when the second display area bends toward a rear direction of the display unit.

The correcting the at least one of the brightness and the color coordinate may include correcting an image to be displayed in the second display area to reduce a red color of the image to be displayed in the second display area when the second display area bends toward a rear direction of the display unit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
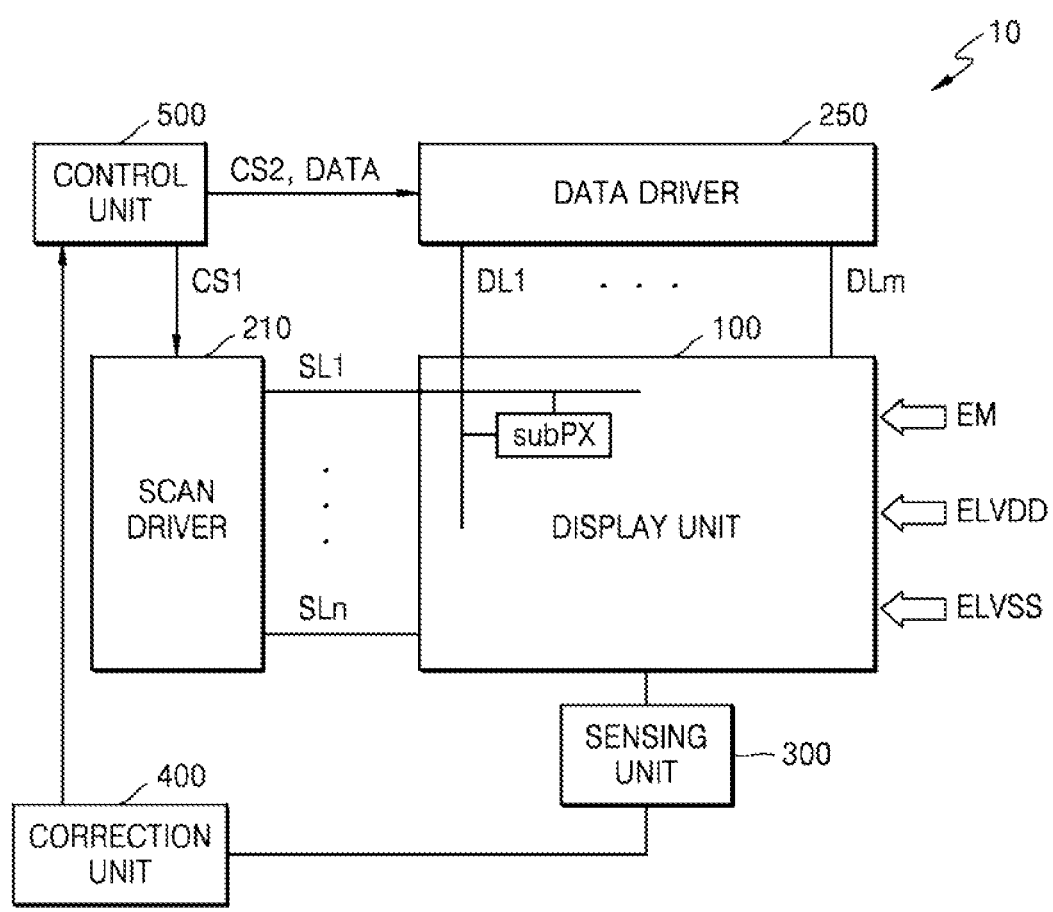
FIG. 1 is a schematic block diagram illustrating a structure of a flexible display device according to an embodiment of the present invention.

The present invention may be embodied with many different modifications and thus may include several embodiments. Therefore, specific embodiments will be shown in the drawings and described in detail. However, it will be understood by those of ordinary skill in the art that various changes in form and details may be made therein without departing from the spirit and scope of the present invention as defined by the following claims. In describing the present invention, if it is determined that specific descriptions for related well-known techniques obscure the scope of the present invention, they will be omitted.

Although terms like first and second may be used to describe various components, the components are not limited to the terms. The terms are only used to distinguish one component from another component.

Terms used in this specification are used for describe specific embodiments, and are not intended to limit the scope of the present invention. A singular form used for the terms herein may include a plural form unless being clearly different from the context. In this specification, the meaning of "include," "comprise," "including," or "comprising," specifies a property, a region, a fixed number, a step, a process, an element and/or a component but does not exclude other properties, regions, fixed numbers, steps, processes, elements and/or components.

Hereinafter, a flexible display device according to the present invention will be described in more detail with reference to the accompanying drawings. Like reference numerals refer to like elements and redundant descriptions according thereto will be omitted.

Figure 2A:
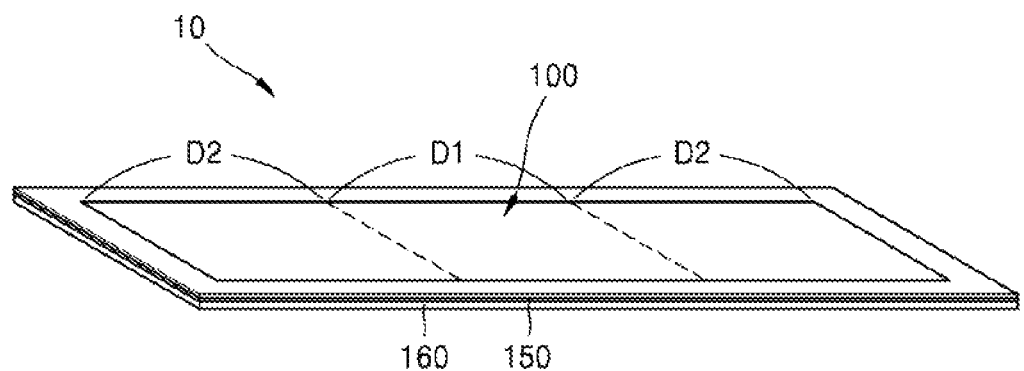
FIG. 2A is a perspective view when a flexible display device is flat.

FIG. 1 is a block diagram illustrating a structure of a flexible display device 10 according to an embodiment of the present invention. FIG. 2A is a perspective view when the flexible display device 10 of FIG. 1 is flat. FIGS. 2B to 2E are views illustrating various examples when the flexible display device 10 of FIG. 1 bends.

Referring to FIG. 1, the flexible display device 10 includes a display unit 100, a gate driver 210, a data driver 250, a sensing unit 300, a correction unit 400, and a control unit 500.

In the display unit 100, a plurality of scan lines SL1 to SLn uniformly spaced in rows and a plurality of data lines DL1 to DLm uniformly spaced in columns are arranged in a matrix. Sub-pixels subPX are arranged in a matrix (two-dimensional array) in the intersection areas of the scan lines SL1 to SLn and the data lines DL1 to DLm. An arrangement direction of the sub-pixels subPX in each row, i.e., a direction along a scan line, is defined as a row direction, and an arrangement direction of the sub-pixels subPX in each column, i.e., a direction perpendicular to the scan line, is defined as a column direction. Here, the sub-pixel subPX means a red pixel, a green pixel, or a blue pixel. A set of the red, green, and blue pixels is referred to as one pixel.

A scan driver 210 generates scan signals and then, sequentially supplies them to the display unit 100 through the plurality of scan lines SL1 to SLn.

The data driver 250 sequentially supplies data signals to the display unit 100 through the plurality of data lines DL1 to DLn. The data driver 250 coverts input image data DATA having a gradation inputted from the control unit 500 into a voltage or current form of a data signal.

The sensing unit 300 measures the degree of bending between a first display area D1 and a second display area D2, and applies its result to the correction unit 400. Then, the correction unit 400 determines a correction value for a sub-pixel or pixel on the basis of the degree of bending between the first display area D1 and the second display area D2.

The control unit 500 generates a scan control signal CS1 and a data control signal CS2 and then, delivers them to the scan driver 210 and the data driver 250, respectively. Accordingly, the scan driver 210 sequentially applies scan signals to a scan line, and the data driver 250 applies a data signal to each pixel. The control unit 500 receives a correction value from the correction unit 400, and corrects a data signal on the basis of the correction value, and then outputs the corrected data DATA to the data driver 250. Additionally, a first power ELVDD, a second power ELVSS, a light emission control signal EM, and an initialize signal Vint (shown in FIG. 5) may be applied to each pixel under a control of the control unit 500.

Referring to FIGS. 2A to 2E, the flexible display device 10 includes a flexible display unit 100 displaying an image.

The display unit 100 may include at least one thin film transistor (TFT) and an organic light emitting display (OLED) device, but it is not limited thereto. In addition to the OLED, the flexible display device 10 may employ other types of display devices such as a liquid crystal display panel, a field emission display device, an electroluminescent display device, and an electrophoretic display device.

The display unit 100 is combined with a touch screen, a display driver IC (DDI), a flexible printed circuit board (FPCB), a polarizing plate, and a window cover.

The display unit 100 includes a first display area D1 and a second display area D2 at both sides of the first display area D1. The second display areas D2 may be disposed at the left and right sides of the first display area D1. The positions of the second display areas D2 are not limited thereto, and thus, may be disposed at the top and bottom sides of the first display area D1. Moreover, the first display area D1 may be disposed at the right and the second display area D2 may be disposed at the left in the display unit 100, or the first display area D1 may be disposed at the top and the second display area D2 may be disposed at the bottom in the display unit 100. Also, their opposite arrangements are possible.

The first display area D1 may be flat. The second display area D2 may include a bending area D21 that is bendable, and a flat area D22 that is flat. The bending area D21 connects the flat area D22 to the first display area D1. Therefore, the second display area D2 may rotate toward the front or rear direction of the display unit 100 with respect to the first display area D1. Even when the second display area D2 rotates with respect to the first display area D1, the flat area D22 of the second display area D2 may not bend.

Figure 2B:
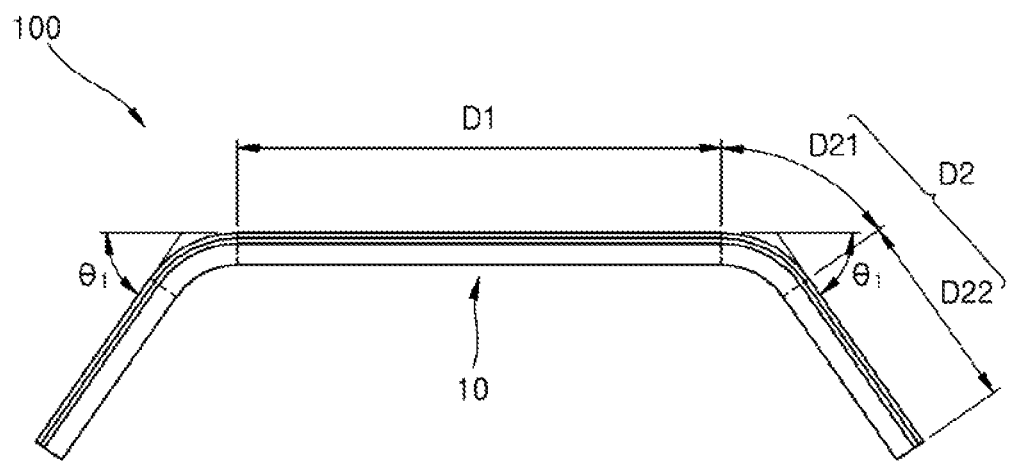
FIGS. 2B to 2E are views illustrating various examples when a flexible display device bends.
Figure 2C:
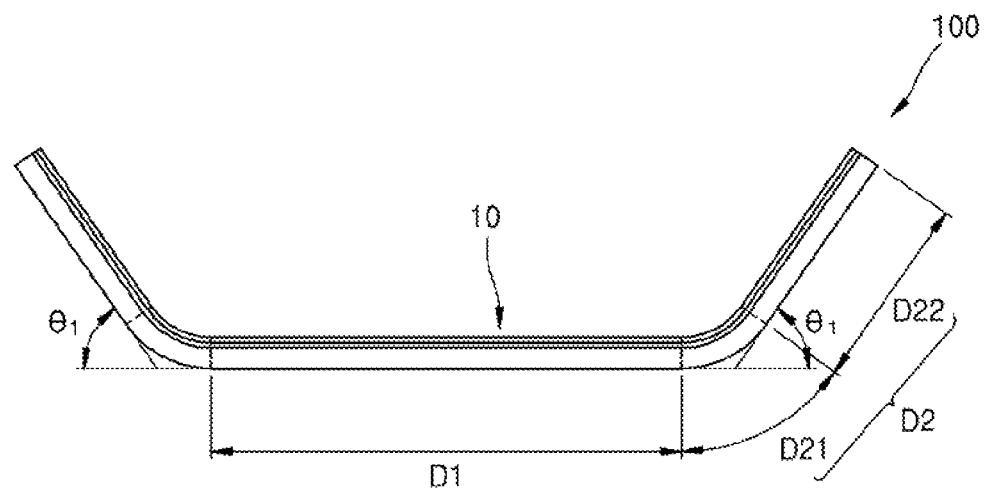
Figure 2D:
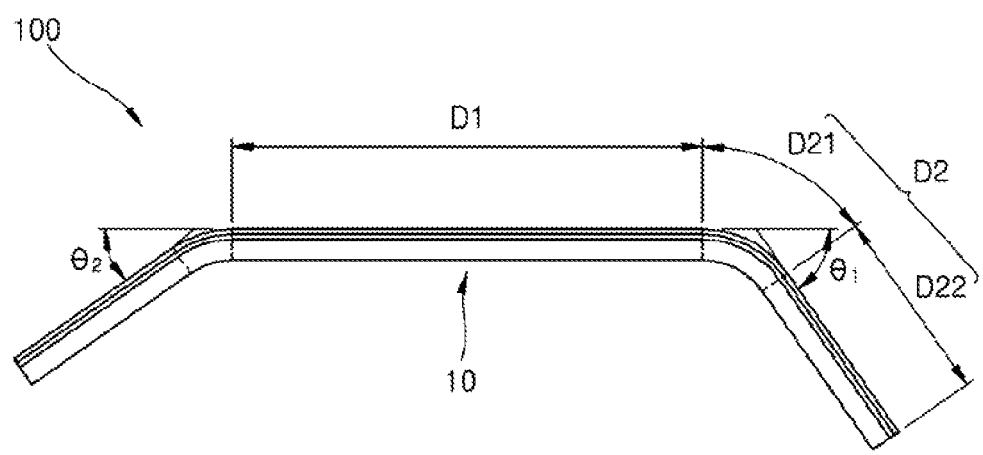
Figure 2E:
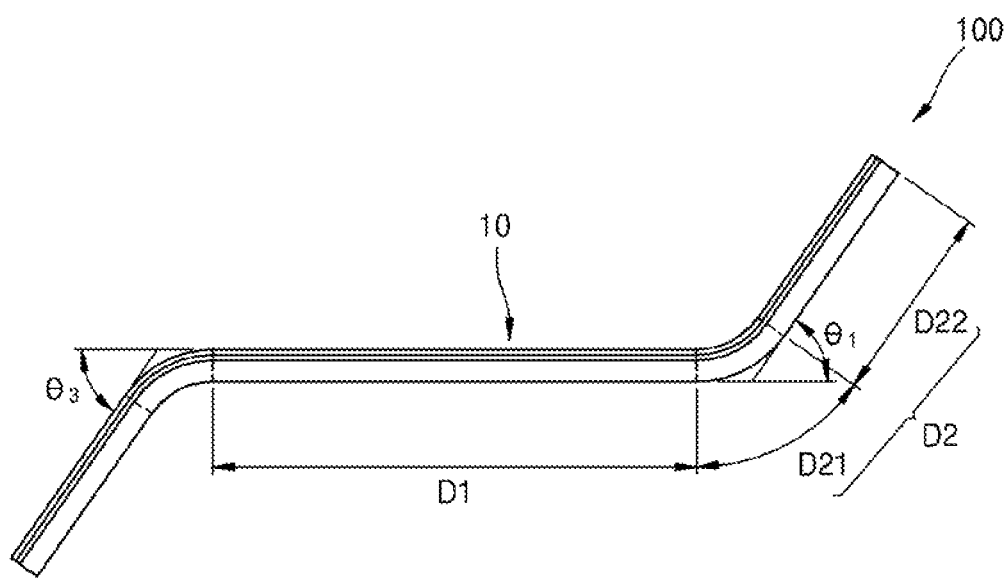

The second display area D2 may bend at a predetermined angle θ1, θ2 or θ3, shown in FIGS. 2A through 2E, with respect to the first display area D1. At this point, the degree of bending of the second display areas D2 at both sides of the first display area D1 may be symmetric on the basis of the first display area D1 as shown in FIGS. 2B and 2C, or may be asymmetric as shown in FIGS. 2D and 2E. The bending angle of the display unit 100 may be fixed or may vary depending on an external impact.

Moreover, a casing 150 is installed at the bottom of the display unit 100 so as to mount the display unit 100. The casing 150 may be formed of any material having flexibility.

A slap unit 160 bending with the display unit 100 is installed at the bottom of the casing 150. The slap unit 160 may have a bending unit. Therefore, the second display area D2 may rotate on the basis of the bending unit.

A user may bend the flexible display device 10 back and forth by applying a compressive stress to the edge of the flexible display device 10. A user may unbend the flexible display device 10 by applying a compressive stress to the edge of the flexible display device 10. In such a way, the flexible display device 10 may be bent or unbent repeatedly depending on stress.

Figure 3:
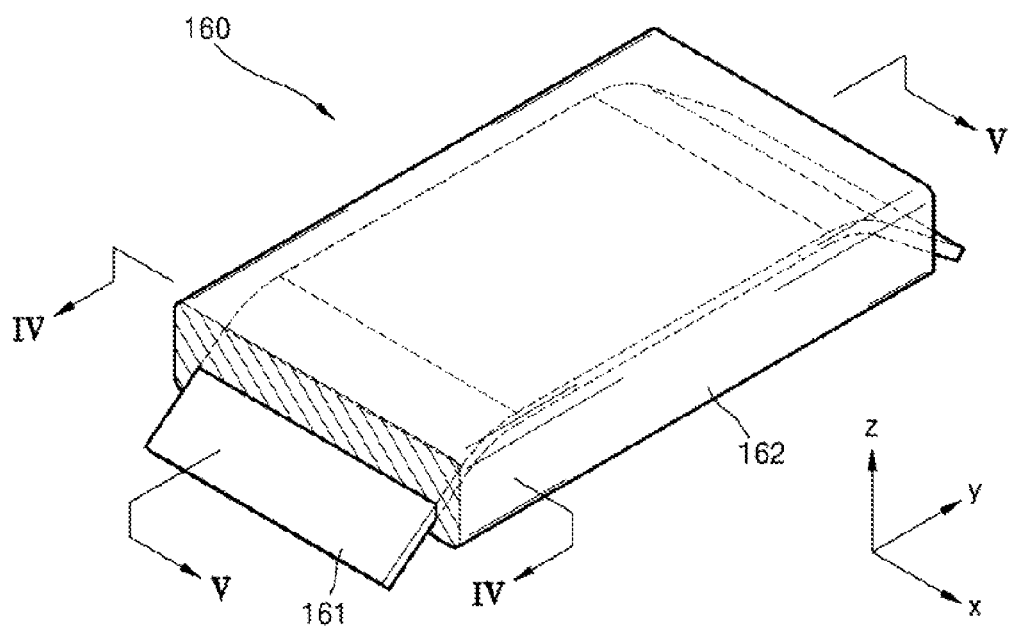
FIG. 3 is a perspective view when a portion of a slap unit is cut off.
Figure 4A:
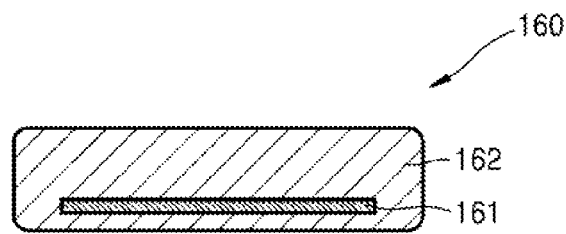
FIG. 4A is a cross-sectional view taken along a line IV-IV when a slap unit unbends.
Figure 4B:
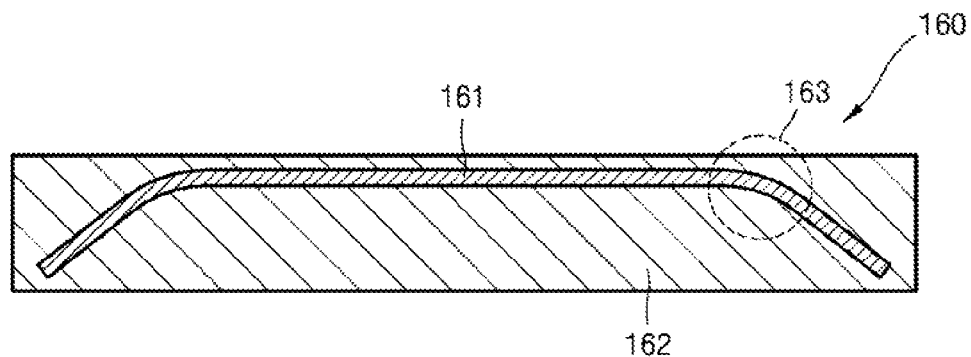
FIG. 4B is a cross-sectional view taken along a line V-V when a slap unit unbends.

FIG. 3 is a perspective view when a portion of the slap unit 160 of FIG. 2A is cut off. FIG. 4A is a cross-sectional view taken along a line IV-IV when the slap unit 160 of FIG. 3 unbends. FIG. 4B is a cross-sectional view taken along a line V-V when the slap unit 160 of FIG. 3 unbends.

Referring to the drawings, the slap unit 160 includes a form variable unit 161 and a housing unit 162.

The slap unit 160 may include a bending unit to maintain a bending state or a bending state stably. For example, the form variable unit 161 may include a bending unit 163 (FIG. 4B) in an area corresponding to the bending area D21 of the second display area D2. The form variable unit 161 is formed of a metallic thin plate having flexibility.

In addition, the form variable unit 161 may be surrounded by the housing unit 162. The housing unit 162 is formed of a material having elasticity such as silicon or rubber. As an alternative, an adhesive layer formed of a material having elasticity may be formed between the display unit 100 and the form variable unit 161.

The housing unit 162 surrounds the form variable unit 161 and the surface of the housing unit 162 may be flat to maintain the display unit 100 in a completely unbending state when the flexible display device 10 unbends. Therefore, the housing unit 162 may have a thickness so as to surround the form variable unit 161 over an entire area and maintain a predetermined width of the entire slap unit 160.

Referring to FIGS. 3 and 4B, when the slap unit 160 is flat, the form variable unit 161 may maintain a straight form in a width direction and a bending form in a length direction. In such a way, even when the display unit 100 is flat, since the form variable unit 161 maintains a bending form to provide a rotation reference of the second display area D2, a state of the flexible display device 10 changes easily.

As the display unit 100 bends, dark shadow, perspective, and refraction at a main viewing angle may vary depending on the position of the display unit 100. Additionally, even when a user stays at the same position, according to the degree of bending of the display unit 100, the viewing angle of the second display area D2 may vary. Accordingly, when the same optical properties are displayed on the entire display unit 100 like a general flat type display unit, non-uniform image quality properties in brightness and saturation are displayed as an image is viewed with an actual eye. For example, according to the degree of bending of the display unit 100, compared to the first display area D1, the second display area D2 may have different brightness and saturation, and also, brightness and saturation may be different even in the second display area D2.

According to an embodiment of the present invention, the display unit 100 includes the sensing unit 300. The sensing unit 300 measures the degree of bending between the first display area D1 and the second display area D2, and changes a data signal of the second display area D2 on the basis of the measured degree of bending, thereby correcting a saturation and brightness difference occurring due to the bending of the display unit 100. The saturation correction may be performed by correcting chromaticity coordinates.

At least one sensing unit 300 may be disposed in a boundary area of the first display area D1 and the second display area D2. For example, the sensing unit 300 may be disposed in the bending area D21 of the second display area D2. Therefore, the sensing unit 300 measures the degree of bending between the first display area D1 and the second display area D2. The sensing unit 300 may be implemented using a bending sensor.

The correction unit 400 receives the degree of bending between the first display area D1 and the second display area D2, from the sensing unit 300. The correction unit 400 determines a correction value for correcting an image to be displayed on the first display area D1 and the second display area D2, on the basis of the received degree of bending.

The correction unit 400 determines a correction value for correcting an image to be displayed on at least one of the first display area D1 and the second display area D2, so as to remove or minimize a saturation or brightness difference between the first display area D1 and the second display area D2. The correction value may include a saturation correction value for correcting saturation and a brightness correction value for correcting brightness. The saturation correction value may be applied by a sub-pixel unit, and the brightness correction value may be applied by a pixel unit.

For example, when the second display area D2 bends toward the front of the display unit 100 on the basis of the first display area D1, the brightness and color temperature of an image in the second display area D2 increase, so that blue color appears stronger. Therefore, the correction unit 400 determines a correction value for correcting an image of the second display area, so as to allow an image to be displayed in the second display area D2 to have the same saturation and brightness as an image displayed on the first display area D1. In more detail, the correction unit 400 may determine a brightness correction value for reducing brightness and a saturation correction value for reducing blue color.

Moreover, when the second display area D2 bends toward the rear of the display unit 100 on the basis of the first display area D1, the brightness and color temperature of an image in the second display area D2 decrease, so that red color appears stronger. Therefore, the correction unit 400 determines a brightness correction value for increasing the brightness and a saturation correction value for reducing red color, so as to allow an image to be displayed in the second display area D2 to have the same saturation and brightness as an image displayed on the first display area D1.

The control unit 500 receives a correction value from the correction unit 400, and then outputs image data DATA corrected based on the correction value, to the data driver 250.

Additionally, even when the second display area D2 has the same degree of bending with respect to the first display area D1, a viewing angle may vary depending on the position of the second display area D2. Therefore, the compensation unit 400 may need to correct an image of the second display area D2 according to the position of the second display area D2. For example, if a pixel (or a sub-pixel) in the second display area D2 is disposed farther away from the first display area D1, the correction unit 400 may more correct an image of the pixel.

Moreover, the correction unit 400 may pre-store a lookup table defining a correction value relationship between the degree of bending and a data signal applied to the first display area D1 and the second display area D2. In addition, the correction unit 400 may determine a correction value of a data signal for correcting saturation and brightness, with reference to the lookup table.

On receiving a saturation and brightness correction request by a user's input while an image is displayed on the display unit 100, the display device 10 measures a bending angle with respect to a current frame by using the sensing unit 300, and corrects a saturation by each display area of the display unit 100, on the basis of the bending angle.

Alternatively, while an image is displayed on the display unit 100, the display device 10 measures a bending angle between the first display area D1 and the second display area D2 at a predetermined frame interval by using the sensing unit 300, and corrects a saturation by each display area of the display unit 100, on the basis of the bending angle.

Figure 5:
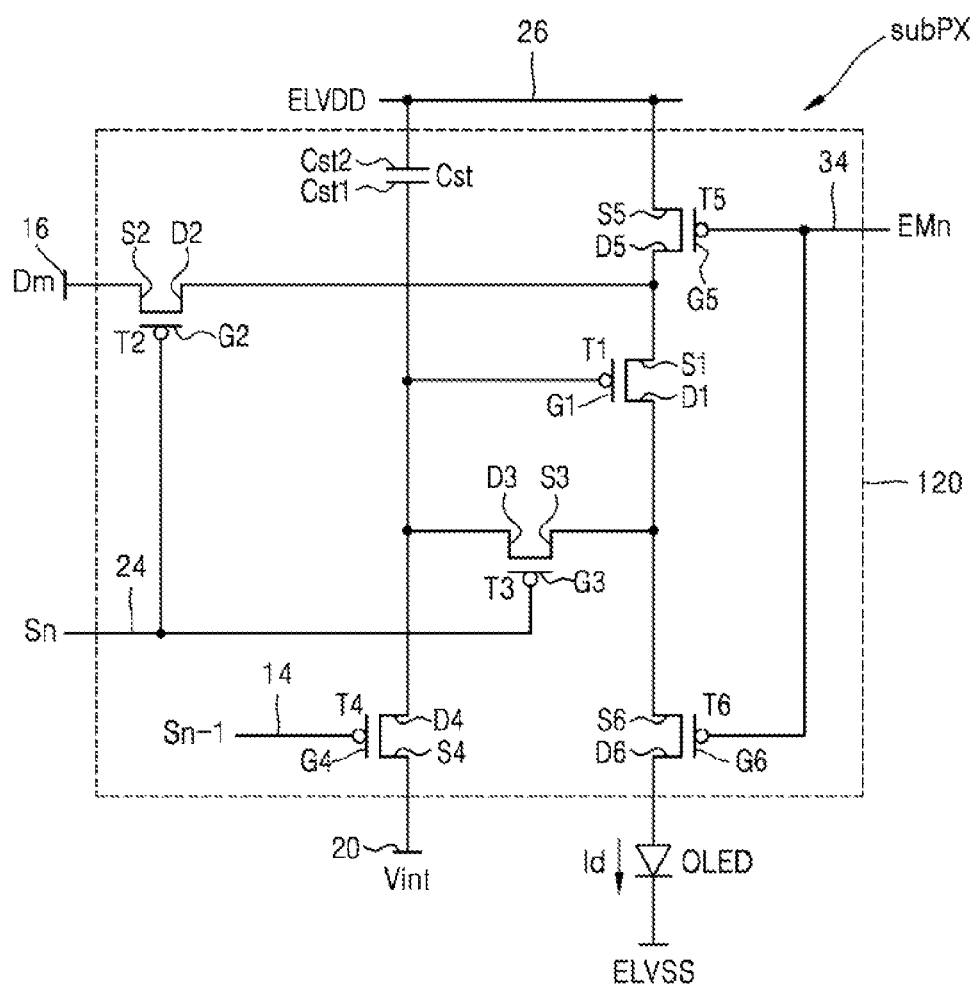
FIG. 5 is a circuit diagram of a sub-pixel according to an embodiment of the present invention.
Figure 6:
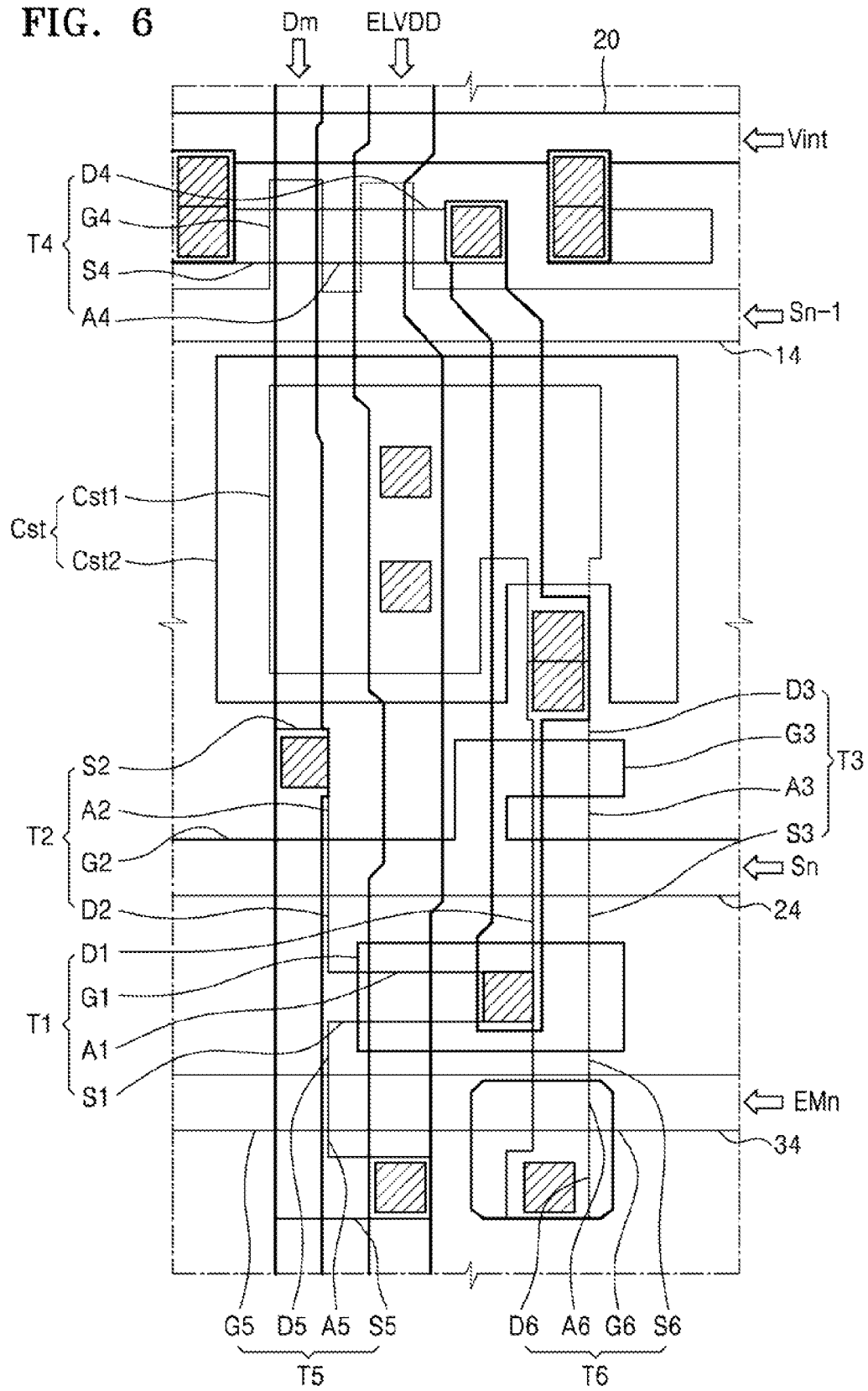
FIG. 6 is a cross-sectional view of a sub-pixel circuit of FIG. 5.

FIG. 5 is a circuit diagram of a sub-pixel according to an embodiment of the present invention. FIG. 6 is a cross-sectional view of a sub-pixel circuit of FIG. 5.

Referring to FIGS. 5 and 6, one sub-pixel subPX of the display unit 100 may include six thin film transistors (TFTs) and one capacitor.

The sub-pixel subPX includes a sub-pixel circuit 120 including a plurality of TFTs T1 through T6 and a storage capacitor Cst. Also, the sub-pixel subPX includes an organic light emitting display (OLED) device that emits light by receiving driving voltage through the sub-pixel circuit 120.

Moreover, the sub-pixel subPX includes a scan line 24 delivering a scan signal Sn, a previous scan line 14 delivering a previous scan signal Sn-1 to the initializing TFT T4, a light emission controlling line 34 delivering a light emission control signal EMn to the operation controlling TFT T5 and the light emission controlling TFT T6, a data line 16 intersecting the scan line 24 and delivering a data signal Dm, a driving voltage line 26 delivering a first power ELVDD and disposed almost in parallel to the data line 16, and an initializing voltage line 20 delivering an initializing voltage Vint to initialize the driving TFT T1.

The TFTs T1 to T6 include the driving TFT T1, the switching TFT T2, the compensating TFT T3, the initializing TFT T4, the operation controlling TFT T5, and the light emission controlling TFT T6. Herein, the case in which a TFT is a PMOS TFT will be described as an example.

The driving TFT T1, the switching TFT T2, the compensating TFT T3, the initializing TFT T4, the operation controlling TFT T5, and the light emission controlling TFT T6 are formed along a semiconductor layer. The semiconductor layer is formed of polysilicon and includes a channel area undoped with an impurity and a source and drain area doped with an impurity at both sides of the channel area. Here, the impurity varies depending on a type of a TFT, and an N type impurity or a P type impurity is possible. The semiconductor layer includes a driving semiconductor layer of the driving TFT T1, a switching semiconductor layer of the switching TFT T2, a compensating semiconductor layer of the compensating TFT T3, an initializing semiconductor layer of the initializing TFT T4, an operation controlling semiconductor layer of the operation controlling TFT T5, and a light emission controlling semiconductor layer of the light emission controlling TFT T6.

The driving TFT T1 includes a driving semiconductor layer A1, a driving gate electrode G1, a driving source electrode S1, and a driving drain electrode D1. The driving gate electrode G1 of the driving TFT T1 is connected to a first electrode Cst1 of the storage capacitor Cst. The driving source electrode S1 is connected to the driving voltage line 26 via the operation controlling TFT T5. The driving drain electrode D1 is electrically connected to an anode electrode of the OLED via the light emission controlling TFT T6. The driving TFT T1 receives the data signal Dm according to a switching operation of the switching TFT T2 and supplies a driving current Id to the OLED. Although not shown in the drawing, the driving gate electrode G1 covers a channel area of the driving semiconductor layer A1, and a first insulating layer and a second insulating layer thereon are disposed between the driving semiconductor layer A1 and the driving gate electrode G1. The driving gate electrode G1 is connected to the first electrode Cst1 of the storage capacitor Cst by a connection means via a contact hole. The first electrode Cst1 of the storage capacitor Cst is disposed on the first insulating layer. The driving source electrode S1 corresponds to a driving source area doped with an impurity in the driving semiconductor layer A1 and the driving drain electrode D1 corresponds to a driving drain area doped with an impurity in the driving semiconductor layer A1.

The switching TFT T2 includes a switching semiconductor layer A2, a switching gate electrode G2, a switching source electrode S2, and a switching drain electrode D2. The switching gate electrode G2 of the switching TFT T2 is connected to the scan line 24. The switching source electrode S2 is connected to the data line 16. The drain electrode D2 is connected to the source electrode S1 of the driving TFT T1 and also is connected to the driving voltage line 26 via the operation controlling TFT T5. The switching TFT T2 is turned on in response to the scan signal Sn received through the scan line 24, and then, performs a switching operation for delivering the data signal Dm delivered to the data line 16 to the driving source electrode S1 of the driving TFT T1. Moreover, the switching source electrode S2 corresponds to a switching source area doped with an impurity in the switching semiconductor layer A2 and the switching drain electrode D2 corresponds to a switching drain area doped with an impurity in the switching semiconductor layer A2.

The compensating TFT T3 includes a compensating semiconductor layer A3, a compensating gate electrode G3, a compensating source electrode S3, and a compensating drain electrode D3. The compensating gate electrode G3 of the compensating TFT T3 is connected to the scan line 24. The compensating source electrode S3 is connected to the driving drain electrode D1 of the driving TFT T1 and is connected to an anode electrode of the OLED via the light emission controlling TFT T6. The compensating drain electrode D3 is connected to the initializing drain electrode D4 of the initializing TFT T4 and the driving gate electrode G1 of the driving TFT T1. The compensating TFT T3 is turned on in response to the scan signal Sn received through the scan line 24, and then, connects the driving gate electrode G1 and the driving drain electrode D1 of the driving TFT T1, thereby connecting the driving TFT T1 to a diode. The compensating gate electrode G3 forms a dual gate electrode so as to prevent leakage current. Moreover, the compensating source electrode S3 corresponds to a compensating source area doped with an impurity in the compensating semiconductor layer A3 and the compensating drain electrode D3 corresponds to a compensating drain area doped with an impurity in the compensating semiconductor layer A3.

The initializing TFT T4 includes an initializing semiconductor layer A4, an initializing gate electrode G4, an initializing source electrode S4, and an initializing drain electrode D4. The initializing gate electrode G4 of the initializing TFT T4 is connected to the previous scan line 14. The initializing source electrode S4 is connected to the initializing voltage line 20. The initializing drain electrode D4 is connected to one end Cst1 of the storage capacitor Cst, the compensating drain electrode D3 of the compensating TFT T3, and the driving gate electrode G1 of the driving TFT T1. The initializing TFT T4 is turned on in response to the previous scan signal Sn−1 received through the previous scan line 14, and then, delivers an initializing voltage Vint to the driving gate electrode G1 of the driving TFT T1, so as to perform an initializing operation for initializing a voltage of the driving gate electrode G1 of the driving TFT T1. The initializing gate electrode G4 may be formed of a dual gate electrode.

The operation controlling TFT T5 includes an operation controlling semiconductor layer A5, an operation controlling gate electrode G5, an operation controlling source electrode S5, and an operation controlling drain electrode D5. The operation controlling gate electrode G5 of the operation controlling TFT T5 is connected to the light emission controlling line 34. The operation controlling source electrode S5 is connected to the driving voltage line 26. The operation controlling drain electrode D5 is connected to the driving source electrode S1 of the driving TFT T1 and the switching drain electrode D2 of the switching TFT T2. The operation controlling source electrode S5 corresponds to an operation controlling source area doped with an impurity in the operation controlling semiconductor layer A5 and the operation controlling drain electrode D5 corresponds to an operation controlling drain area doped with an impurity in the operation controlling semiconductor layer A5.

The light emission controlling TFT T6 includes a light emission controlling semiconductor layer A6, a light emission controlling gate electrode G6, a light emission controlling source electrode S6, and a light emission controlling drain electrode D6. The light emission controlling gate electrode G6 of the light emission controlling TFT T6 is connected to the light emission controlling line 34. The light emission controlling source electrode S6 is connected to the driving drain electrode D1 of the driving TFT T1 and the compensating source electrode S3 of the compensating TFT T3. The light emission controlling drain electrode D6 is electrically connected to an anode electrode of the OLED. The operation controlling TFT T5 and the light emission controlling TFT T6 are turned on simultaneously in response to a light emission control signal EMn received through the light emission controlling line 34, so that the first power ELVDD is delivered to the OLED so as to allow the driving current Id to flow in the OLED. The light emission controlling source electrode S6 corresponds to a light emission controlling source area doped with an impurity in the light emission controlling semiconductor layer A6 and the light emission controlling drain electrode D6 is connected to an anode electrode by a connection member.

The first electrode Cst1 of the storage capacitor Cst is connected to the driving gate electrode G1 of the driving TFT T1, the compensating drain electrode D3 of the compensating TFT T3, and the initializing drain electrode D4 of the initializing TFT T4, through a connection node. The first electrode Cst1 is formed of a floating electrode having a island form, is formed of the same material as and is disposed at the same layer as the previous scan line 14, the light emission controlling line 34, the initializing gate electrode G4, the operation controlling gate electrode G5, and the light emission controlling gate electrode G6.

The second electrode Cst2 of the storage capacitor Cst is connected to the driving voltage line 26. The second electrode Cst2 may be formed of a floating electrode having an island form and may be disposed to overlap the entire first electrode Cst1. The first electrode Cst2 is formed of the same material as and is disposed at the same layer as the initializing voltage line 20, the scan line 24, the driving gate electrode G1, the switching gate electrode G2, and the compensating gate electrode G3.

The two insulating layers are disposed between the semiconductor layer and the gate electrode, so that a gate insulating layer thicker than one gate insulting layer of the initializing TFT T4, the operation controlling TFT T5, and the light emission controlling TFT T6 is disposed in the driving TFT T1, the switching TFT T2, and the compensating TFT T3.

The cathode electrode of the OLED is connected to the second power ELVSS. Accordingly, the OLED receives the driving current Id from the driving TFT T1 and emits light to display an image.

Hereinafter, a specific operation of the sub-pixel of FIG. 5 will be described.

First, a low level previous scan signal Sn−1 is applied through the previous scan line 14 during an initializing period. Then, the initializing TFT T4 is turned on in response to a low level previous scan signal Sn−1, and the initializing voltage Vint is applied from the initializing voltage line 20 to the gate electrode of the driving TFT T1 through the initializing TFT T4. The driving TFT T1 is initialized by the initializing voltage Vint.

Then, a low level scan signal Sn is applied through a scan line 24 during a data programming period. Then, the switching TFT T2 and the compensating TFT T3 are turned on in response to the low level scan signal Sn. At this point, the driving TFT T1 is connected to a diode by the turned-on compensating TFT T3, and is forward-biased. Then, a compensating voltage (Dm+Vth, Vth is a negative value) obtained by reducing the data signal Dm supplied from the data line 16 by a threshold voltage Vth of the driving TFT T1 is applied to the gate electrode of the driving TFT T1.

The driving voltage ELVDD and the compensating voltage (Dm+Vth) are applied to both ends of the storage capacitor Cst, and charges corresponding to a voltage difference at both ends are stored in the storage capacitor Cst. Then, the light emission control signal En supplied from the light emission controlling line 34 changes from a high level into a low level during a light emitting period. Then, the operation controlling TFT T5 and the light emission controlling TFT T6 are turned on in response to the low level light emission control signal EMn during a light emitting period.

Then, the driving current Id occurs according to a voltage difference between a voltage of the gate electrode of the driving TFT T1 and the driving voltage ELVDD, and the driving current Id is supplied to the OLED through the light emission controlling TFT T6. During a light emitting period, a gate-source voltage Vgs of the driving TFT T1 is maintained as {(Dm+Vth)-ELVDD} by the storage capacitor Cst, and according to a current-voltage relationship of the driving TFT T1, the driving current Id is proportional to the square of a value {(Dm−ELVDD)2} obtained by subtracting a threshold voltage from a gate-source voltage. That is, according to the data signal Dm, the luminance and luminous color of the OLED may be controlled.

Accordingly, the display device 10 adjusts the data signal Dm in correspondence to a bending angle of the display unit 100, so that image quality characteristics of the display unit 100 may become uniform.

Figure 7:
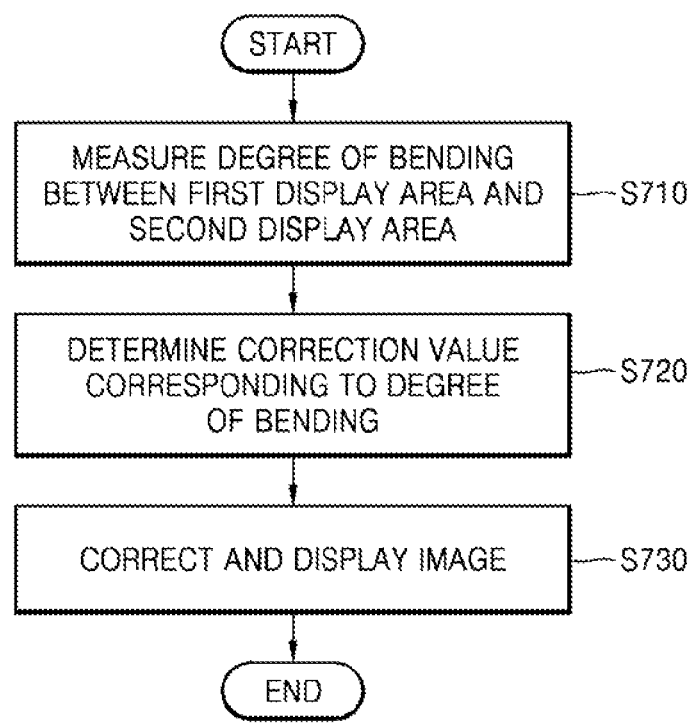
FIG. 7 is a flowchart illustrating a method of correcting an image as a display device bends according to an embodiment of the present invention.

FIG. 7 is a flowchart illustrating a method of correcting an image as the display device 10 bends according to an embodiment of the present invention.

First, the sensing unit 300 measures the degree of bending between the first display area D1 and the second display area D2 in operation S710. At least one bending sensor may be disposed in a boundary area of the first display area D1 and the second display area D2. As the second display area D2 bends with respect to the first display area D1, the bending sensor measures the degree of bending between the first display area D1 and the second display area D2 and applies its result to the correction unit 400. When it is determined that the second display area D2 bends with respect to the first display area D1, the correction unit 400 determines a correction value to minimize a brightness and saturation difference between the first display area D1 and the second display area D2 in operation S720. The correction unit 400 may pre-store a lookup table which includes correction values for minimizing differences in brightness and saturation between the first display area D1 and the second display area D2 at every degree of bending. Therefore, the correction unit 400 may read brightness and saturation correction values from the lookup table, which correspond to the measurement value received from the sensing unit 300. The brightness and saturation correction values may be different based on the location of a pixel (or a sub-pixel). For example, the brightness and saturation correction values of a pixel may depend on a distance between the pixel and the first display area D1 or a distance between the pixel and the second display area D2. The correction unit 400 also may pre-store a lookup table made based on the locations of pixels.

The control unit 500 corrects an image according to the correction value received from the correction unit 400, and then, displays the corrected image on the display unit 100 in operation S730. The correction unit 400 may adjust a data signal applied to at least one display area of the first display area D1 and the second display area D2, so as to minimize brightness and saturation differences between the first display area D1 and the second display area D2. The brightness correction of the first display area D1 and the second display area D2 may be performed by adjusting a voltage level of a data signal applied to the pixels of the first display area D1 and the second display area D2, and the saturation correction of the first display area D1 and the second display area D2 may be performed by adjusting a voltage level of a data signal applied to sub-pixels of the first display area D1 and the second display area D2. Herein, how much the brightness, saturation or the color coordinate is changed is referred to as a degree of correction. For example, a higher change of the brightness can be considered to as a higher degree of correction.

For example, when the brightness of the second display area D2 is greater than that of the first display area D1, the control unit lowers a data signal applied to a pixel of the second display area D2 by a predetermined level, so that the brightness of the second display area D2 may be lowered. In lowering the brightness of the second display area D2, as pixels in the second display area D2 are farther away from the first display area D1, the control unit 500 may further lower a voltage level of a data signal. Therefore, as pixels in the second display area D2 are farther away from the first display area D1, their brightness are corrected to be further lowered.

In addition, when the saturation of the second display area D2 is tinged with more blue color than that of the first display area D1, the control unit lowers a data signal applied to a blue sub-pixel of the second display area D2 by a predetermined level, so that the saturation of the second display area D2 may be changed. In changing the saturation of the second display area D2, as blue sub-pixels in the second display area D2 are farther away from the first display area D1, the control unit 500 may further lower a voltage level of a data signal.

Furthermore, by simultaneously adjusting the saturation and brightness of the second display area D2 and the saturation and brightness of the first display area D1, differences in brightness and saturation between the first display area D1 and the second display area D2 may be minimized.

Under the environment where the external illumination of the first display area D1 and the second display area D2 is the same, a brightness and saturation difference between the first display area D1 and the second display area occurs due to the bending angle of the display unit 100. Accordingly, by correcting data signals of the first display area D1 and the second display area, a brightness and saturation difference at each position due to the bending of the display unit 100 may be reduced.

The embodiments of the present invention describe a display device including a sub-pixel configured with a PMOS TFT as an example, but the present invention is not limited thereto. That is, the present invention is also applied to a display device including a pixel configured with an NMOS TFT. In this case, by raising a data signal applied to a pixel by a predetermined level, saturation may be increased.

In the above embodiments, for convenience of description, the case in which brightness and saturations are corrected in an entire first display area or an entire second display area is described as an example. However, the present invention is not limited thereto. It is apparent that according to a panel design, after a first display area and a second display area are divided into a plurality of areas, the degree of bending is measured in each area by using at least one bending sensor disposed in a boundary area, and then, a data signal is differently adjusted in each area on the basis of a measured result, so that an entire saturation of a flexible display unit may be uniform. Furthermore, a bending sensor may be disposed in an area corresponding to each pixel of the second display area.

Moreover, the embodiments of the present invention describe the driving TFT of the sub-pixel of FIG. 5 as an example, but the present invention is not limited thereto. It is apparent that the present invention may be applied to a pixel including a driving TFT that supplies driving current in connection to a light emitting device and a flexible display unit including the same.

By correcting an image to be displayed in a bending area, a color sense difference between an image displayed in a flat area and an image displayed in a bending area is reduced, so that non-uniform image quality may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flexible display device, comprising:
a display unit comprising a first display area and a second display area bendable with respect to the first display area, the second display area comprising a bending area bendable and a flat area having a flat form, the bending area connecting the flat area to the first display area;
a control unit coupled to the display unit, the control unit performing a correction of at least one of a brightness and a color coordinate of an image to be displayed in at least one of the first display area and the second display area according to a degree of bending between the first display area and the second display area, a degree of the correction of a first pixel in the second display area being larger than a degree of the correction of a second pixel in the second display area when the first pixel in the second display area is disposed farther from the first display area than the second pixel in the second display area, both of the first pixel and the second pixel being in the same flat area of the second display area; and
a backplate attached to one side of the display unit to be bent together with the display unit, the backplate comprising:
a bendable housing unit; and
a metallic plate embedded in the housing unit, the metallic plate comprising a bent portion disposed at the interface between the first display area and the second display area, wherein the metallic plate maintains a bent form even when the display unit is not bent.

2. The flexible display device of claim 1, further comprising a sensing unit coupled to the display unit and measuring the degree of bending between the first display area and the second display area.

3. The flexible display device of claim 1, wherein the second display area is bendable in a front or rear direction of the display unit, with respect to the first display area.

4. The flexible display device of claim 1, wherein the control unit corrects an image to be displayed in the second display area to reduce a brightness of the image to be displayed in the second display area when the second display area bends toward a front direction of the display unit.

5. The flexible display device of claim 1, wherein the control unit corrects an image to be displayed in the second display area to reduce a blue color of the image to be displayed in the second display area when the second display area bends toward a front direction of the display unit.

6. The flexible display device of claim 1, wherein the control unit corrects an image to be displayed in the second display area to increase a brightness of the image to be displayed in the second display area when the second display area bends toward a rear direction of the display unit.

7. The flexible display device of claim 1, wherein the control unit corrects an image to be displayed in the second display area to reduce a red color of the image to be displayed in the second display area when the second display area bends toward a rear direction of the display unit.

8. The flexible display device of claim 1, further comprising a lookup table including correction values predetermined according to the degree of bending between the first display area and the second display area, wherein the control unit receives a correction value corresponding to the degree of bending between the first display area and the second display area by using the lookup table, and corrects an image to be displayed on the display unit.

9. The flexible display device of claim 1, further comprising a slap unit attached to one side of the display unit to be bent together with the display unit, a portion of the slap unit corresponding to an interface between the first display area and the second display area being bent while the second display area is bent with respect to the first display area.

10. The flexible display device of claim 9, wherein the slap unit comprises a form variable unit including a bent unit that maintains a bending form even when the display unit is not bent, the bent unit being disposed at the interface between the first display area and the second display area.

11. A method of controlling a flexible display device including a first display area and a second display area bendable with respect to the first display area, the method comprising:
measuring a degree of bending between the first display area and the second display area, the second display area comprising a bending area bendable and a flat area having a flat form, the bending area connecting the flat area to the first display area;
correcting at least one of a brightness and a color coordinate of an image to be displayed in at least one of the first display area and the second display area according to the degree of bending to produce a corrected image, a degree of said correcting at a first pixel in the second display area being larger than a degree of said correcting at a second pixel in the second display area when the first pixel in the second display area is disposed farther from the first display area than the second pixel in the second display area, both of the first pixel and the second pixel being in the same flat area of the second display area; and displaying the corrected image, wherein the flexible display device comprises a backplate attached to one side of the display unit to be bent together with the display unit, the backplate comprising:
- a bendable housing unit; and
- a metallic plate embedded in the housing unit, the metallic plate comprising a bent portion disposed at the interface between the first display area and the second display area, wherein the metallic plate maintains a bent form even when the display unit is not bent.

12. The method of claim 11, wherein the second display area is bendable in a front or rear direction of the display unit, with respect to the first display area.

13. The method of claim 11, wherein the correcting the at least one of the brightness and the color coordinate comprises correcting an image to be displayed in the second display area to reduce the brightness of the image to be displayed in the second display area when the second display area bends toward a front direction of the display unit.

14. The method of claim 11, wherein the correcting the at least one of the brightness and the color coordinate comprises correcting an image to be displayed in the second display area to reduce a blue color of the image to be displayed in the second display area when the second display area bends toward a front direction of the display unit.

15. The method of claim 11, wherein the correcting the at least one of the brightness and the color coordinate comprises correcting an image to be displayed in the second display area to increase the brightness of the image to be displayed in the second display area when the second display area bends toward a rear direction of the display unit.

16. The method of claim 11, wherein the correcting the at least one of the brightness and the color coordinate comprises correcting an image to be displayed in the second display area to reduce a red color of the image to be displayed in the second display area when the second display area bends toward a rear direction of the display unit.

* * * * *